United States Patent
Koukitu et al.

(10) Patent No.: US 8,926,752 B2
(45) Date of Patent: Jan. 6, 2015

(54) METHOD OF PRODUCING A GROUP III NITRIDE CRYSTAL

(75) Inventors: Akinori Koukitu, Fuchu (JP); Yoshinao Kumagai, Fuchu (JP); Toru Nagashima, Shunan (JP); Kazuya Takada, Shunan (JP); Hiroyuki Yanagi, Shunan (JP)

(73) Assignees: Tokuyama Corporation, Yamaguchi (JP); Tokyo University of Agriculture and Technology, Tokyo (KE)

( * ) Notice: Subject to any disclaimer, the term of this patent is extended or adjusted under 35 U.S.C. 154(b) by 1425 days.

(21) Appl. No.: 12/526,685

(22) PCT Filed: Feb. 27, 2008

(86) PCT No.: PCT/JP2008/053892
§ 371 (c)(1),
(2), (4) Date: Aug. 11, 2009

(87) PCT Pub. No.: WO2018/108381
PCT Pub. Date: Sep. 12, 2008

(65) Prior Publication Data
US 2010/0093124 A1    Apr. 15, 2010

(30) Foreign Application Priority Data

Mar. 2, 2007 (JP) ................................ 2007-052675
Mar. 30, 2007 (JP) ............................... 2007-091218

(51) Int. Cl.
*C30B 25/00* (2006.01)
*C30B 29/40* (2006.01)
*C30B 25/10* (2006.01)
*C30B 25/18* (2006.01)

(52) U.S. Cl.
CPC ............... *C30B 29/403* (2013.01); *C30B 25/10* (2013.01); *C30B 25/18* (2013.01)
USPC .................. 117/89; 117/84; 117/94

(58) Field of Classification Search
CPC ...... C30B 29/403; C30B 25/02; C30B 29/40; C30B 23/00; C30B 23/02; C30B 25/20; C30B 25/00; C30B 23/025; C30B 7/10; C30B 25/165; C30B 23/002; C30B 29/60; C30B 7/105
See application file for complete search history.

(56) References Cited

U.S. PATENT DOCUMENTS

2002/0093055 A1    7/2002    Shibata et al.
2007/0045662 A1    3/2007    Sumiya et al.

FOREIGN PATENT DOCUMENTS

| EP | 2123802 A1 | 11/2009 |
|---|---|---|
| JP | 2002-274996 A | 9/2002 |
| JP | 2005-252248 A | 9/2005 |

(Continued)

OTHER PUBLICATIONS

JP 2006-290662, "Method and Apparatus for Producing Aluminum-Based Group III Nitride Crystal", published on Oct. 26, 2006, computer transltation.*

(Continued)

*Primary Examiner* — Yelena G Gakh
(74) *Attorney, Agent, or Firm* — Birch, Stewart, Kolasch & Birch, LLP

(57) ABSTRACT

There is provided a method capable of obtaining an aluminum-based group III nitride crystal layer having a smooth surface and high crystallinity by employing only HVPE in which inexpensive raw materials can be used to reduce production costs and high-speed film formation is possible without employing MOVPE.

To produce a group III nitride crystal by HVPE comprising the step of growing a group III nitride crystal layer by vapor-phase growth on a single crystal substrate by contacting the heated single crystal substrate with a raw material gas containing a group III halide and a compound having a nitrogen atom, the group III nitride crystal is grown by vapor-phase growth on the single crystal substrate heated at a temperature of 1,000° C. or more and less than 1,200° C. to form an intermediate layer and then, a group III nitride crystal is further grown by vapor-phase growth on the intermediate layer on the substrate heated at a temperature of 1,200° C. or higher.

1 Claim, 1 Drawing Sheet

(56) References Cited

FOREIGN PATENT DOCUMENTS

| | | | |
|---|---|---|---|
| JP | 2006-290662 | A | 10/2006 |
| JP | 2006-335607 | A | 12/2006 |
| JP | 2007-59850 | A | 3/2007 |

OTHER PUBLICATIONS

Supplementary European Search Report dated Jun. 6, 2011 for European Application No. 08721312.0.

* cited by examiner

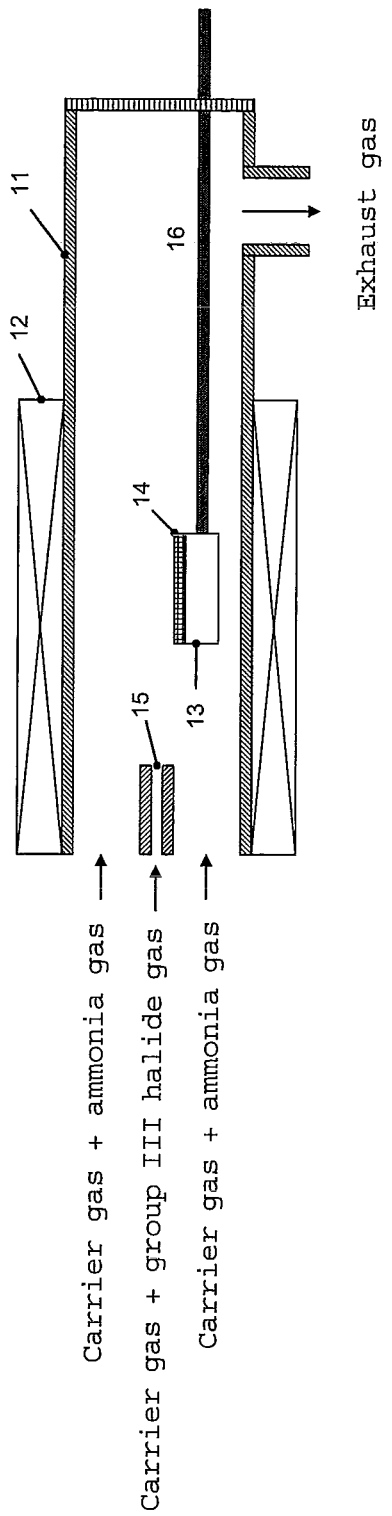

METHOD OF PRODUCING A GROUP III NITRIDE CRYSTAL

TECHNICAL FIELD

The present invention relates to a method of producing a group III nitride crystal such as an aluminum nitride crystal by a vapor-phase growth using a gas of a halide of a group III element as a raw material.

BACKGROUND ART

Group III nitride crystals such as aluminum nitride, gallium nitride and indium nitride have a wide range of band gap energy, and the band gap energy values of these are about 6.2 eV, about 3.4 eV and about 0.7 eV, respectively. These group III nitride crystals can provide a mixed crystal semiconductor having desired composition, and it is possible to control the band gap energy of the mixed crystal based on the above values because the band gap energy of the mixed crystal corresponds to its composition.

Therefore, it is theoretically possible to fabricate a light emitting device which emits a wide range of light from infrared light to ultraviolet light by using a group III nitride crystal. The development of a light emitting device comprising an aluminum-based group III nitride crystal, mainly an aluminum gallium nitride mixed crystal is now under way energetically. The emission of light having short-wavelength in an ultraviolet range is made possible by using an aluminum-based group III nitride crystal, whereby light emitting sources such as an ultraviolet light emitting diode for white light sources, an ultraviolet light emitting diode for sterilization, a laser which can be used to read and write a high-density optical disk memory and a communication laser can be manufactured.

A light emitting device comprising an aluminum-based group III nitride crystal (to be also referred to as "aluminum-based group III nitride light emitting device" hereinafter) is manufactured by forming a laminated structure consisting of semiconductor single crystal thin films, each having a thickness of several microns, specifically a p-type semiconductor layer, a light emitting layer and an n-type semiconductor layer on a substrate sequentially like a conventional light emitting device. This laminated structure is generally formed by a crystal growth method such as molecular beam epitaxy (MBE) or metalorganic vapor phase epitaxy (MOVPE). Researches are now being made to form a preferred laminated structure as a light emitting device by the above method for the manufacture of an aluminum-based group III nitride light emitting device (refer to Japanese Journal of Applied Physics, Vol. 44, No. 10, 2005, pp. 7191-7206).

As the means of forming an aluminum-based group III nitride crystal layer, there is known hydride vapor phase epitaxy (HVPE) (refer to JP-A 2003-303774) besides the above MBE and MOVPE. Although HVPE is more advantageous than MBE and MOVPE in production cost and film forming rate, it has the difficulty of controlling the thickness of each film accurately. Therefore, the above method is rarely employed as the means of forming the crystal layers of a semiconductor light emitting device.

As a substrate which is used in an ultraviolet light emitting device, a sapphire substrate is now generally used from the viewpoints of crystal quality as a substrate, ultraviolet light transmission, mass productivity and cost. However, when a sapphire substrate is used, a problem occurs due to differences in physical properties between the sapphire substrate and aluminum gallium nitride forming a semiconductor laminated film. For instance, due to a difference in lattice constant between the substrate and the semiconductor laminated film (misfit), a crystal defect called "dislocation" is introduced into the semiconductor laminated film. It is generally known that the light emitting performance of a semiconductor laminated film deteriorates or the service life of a device is shortened when a dislocation exists. To prevent the formation of the dislocation by such a misfit, it is proposed to use a template substrate having an aluminum-based group III nitride crystal film on a single crystal substrate such as a sapphire substrate or a self-supporting substrate composed of only an aluminum-based group III nitride crystal.

To manufacture the template substrate or the self-supporting substrate, an aluminum-based group III nitride crystal must be grown by a vapor-phase growth on a single crystal substrate such as a sapphire substrate. MOVPE has been generally employed as a vapor-phase growth for this purpose because a high-quality crystal is obtained. An aluminum-based group III nitride crystal self-supporting substrate can also be obtained by using improved HVPE (refer to JP-A 2005-252248).

In the conventional HVPE, an apparatus in which a substrate installed in a quartz glass reactor tube is heated from the outside of the reaction tube by resistance heating as disclosed by JP-A 2003-303774 is generally used. When this type of apparatus is used, the upper limit of heating temperature is limited to the heat resistance temperature of the quartz glass reactor tube and even when a quartz glass reactor tube having the highest durability is used, it is difficult to carry out crystal growth at 1,200° C. for a long time. However, as disclosed by JP-A 2005-252248, a crystal growth can be conducted at a high substrate temperature of 950 to 1,700° C. by improving the apparatus, and a high-quality aluminum-based group III nitride crystal layer can also be obtained by using a sapphire substrate having an aluminum-based group III nitride crystal film obtained by MOPVE thereon.

As means of obtaining an aluminum-based group III nitride crystal having high crystallinity by HVPE, there is known a method in which a group III halide gas and a nitrogen source gas are reacted with each other while a substrate such as a sapphire is maintained at a low temperature of 300 to 550° C. and then the substrate is heated at a temperature of 1,100 to 1,600° C. to react these gases with each other (refer to JP-A 2006-335607).

To obtain a high-quality aluminum-based group III nitride crystal layer having a smooth surface by the method disclosed by JP-A 2005-252248, a single crystal substrate such as a sapphire substrate having an aluminum-based group III nitride crystal film formed by MOVPE thereon must be used as a substrate. However, as MOVPE has such demerits that the raw materials are expensive and that the film forming rate is low, the use of this method is not always satisfactory from the viewpoints of production cost and efficiency. In the above method, after a film is formed by MOVPE, HVPE must be employed by changing the apparatus or the raw materials. Therefore, the operation becomes complicated, and impurities which contaminate the substrate may be included in the operation process.

Additionally, by the investigation of the inventors of the present invention, it is revealed that the aluminum-based group III nitride crystal obtained by the method disclosed in JP-A 2006-335607 is excellent in crystallinity but its surface smoothness is not satisfactory.

DISCLOSURE OF THE INVENTION

It is therefore an object of the present invention to provide a method capable of obtaining an aluminum-based group III nitride crystal layer having a smooth surface and high crystallinity by employing only HVPE without employing MOVPE.

As shown in FIG. 8(a) of JP-A 2005-252248, in the method disclosed by JP-A 2005-252248, the surface smoothness of the an aluminum nitride (AlN) crystal layer grown directly on a sapphire substrate by HVPE is inferior to that of a AlN crystal layer grown by HVPE on a substrate having an AlN crystal layer formed by MOVPE. The inventors of the present invention investigated the cause of this phenomenon to solve the above problem. As a result, they found the cause of the phenomenon from the observation of the surface state of the substrate before growth. That is, it is found that the deterioration of the material of the substrate before starting vapor-phase growth was started by maintaining the substrate at a high temperature was the cause of degrading the surface morphology and surface smoothness of the AlN crystal.

It was considered that, for example, when an aluminum nitride-based semiconductor crystal is to be grown on a sapphire substrate as an initial substrate at a temperature of 1,200° C. or higher, the decomposition of the substrate occurs due to a reaction between the substrate and a hydrogen gas which is used as a carrier gas in the temperature elevation step before growth, thereby causing step bunching or forming pits, whereby the surface morphology of the substrate is reflected in the crystal growth process with the result of the reduction of the surface smoothness of the grown crystal. In fact, when the inventors of the present invention conducted crystal growth by using a sapphire substrate, silicon carbide substrate, gallium nitride substrate or zinc oxide substrate and heating the substrate at 1,200 to 1,600° C. using a hydrogen gas or inert gas as a carrier gas, the surface smoothness of the substrate deteriorated in the temperature elevation step and the surface morphology and surface roughness of the obtained aluminum nitride crystal corresponded to the deteriorated state of the substrate before growth.

It was considered that this problem can be solved by forming an aluminum-based group III nitride crystal thin film for covering the surface of a substrate at a temperature range at which a relatively good crystal can be formed without causing the decomposition of the substrate and growing a higher quality crystal by raising the temperature. However, even when the method disclosed by the above JP-A 2006-335607 is employed, a desired object cannot be attained.

The inventors of the present invention thought that the reduction of the surface smoothness of a crystal layer formed by the method disclosed by JP-A 2006-335607 is due to the mass transfer during the temperature elevation step which is carried out subsequently because the internal bonding of the crystal layer grown at a low temperature is weak and that the above problem can be solved by carrying out crystal growth at a high temperature after a crystal layer in which the mass transfer hardly occurs is formed at a relatively low temperature. They conducted intensive studies about conditions under which the above crystal layer can be formed.

As a result, they found that an aluminum nitride crystal film having a high crystal quality and such a surface morphology and excellent surface smoothness that a semiconductor laminated film such as a light emitting device can be formed thereon while it is grown can be formed by carrying out initial growth at a temperature range between 1,000° C. and lower than 1,200° C. and then carrying out main growth at a temperature more than 1,200° C. The present invention was accomplished based on this finding.

That is, the means for solving the above problem and provided by the present invention are as follows.

(1) A method of producing a group III nitride crystal by vapor-phase growth, comprising the step of growing a group III nitride crystal on a single crystal substrate by contacting the heated single crystal substrate with a raw material gas containing a group III halide and a compound having a nitrogen atom, wherein
the above step comprises an initial growing substep in which a group III nitride crystal layer is grown by vapor-phase growth on the single crystal substrate heated at a temperature of 1,000° C. or more and less than 1,200° C. and a main growing substep in which a group III nitride crystal is grown by vapor-phase growth on the group III nitride crystal layer obtained in the initial growing substep heated at a temperature of 1,200° C. or higher.
(2) A method of producing a laminated substrate having a single crystal substrate and a group III nitride crystal layer formed on the surface of the single crystal substrate by the method described in the above paragraph (1).
(3) A method of producing a semiconductor device, comprising the step of forming a semiconductor device structure on the group III nitride crystal layer of a laminated substrate obtained by the method described in the above paragraph (2).
(4) A method of producing a self-supporting substrate composed of a group III nitride crystal, comprising the step of separating a group III nitride crystal layer from a laminated substrate obtained by the method described in the above paragraph (2).
(5) A method of producing a semiconductor device, comprising the step of forming a semiconductor device structure on a self-supporting substrate composed of a group III nitride crystal obtained by the method described in the above paragraph (4).

Since a high-quality crystal nucleus can be formed without causing the decomposition of a substrate when the group III nitride crystal is grown in the main growing substep in the method (1), it is preferred that a group III nitride crystal layer having a thickness of 0.5 to 500 nm should be formed in the above initial growing substep. Since a group III nitride crystal having high crystallinity can be formed even at a high growth rate of several tens of μm/h or more, it is preferred that the method (1) should further comprises the step of heating the group III nitride crystal layer obtained in the initial growing substep at a temperature of 1,200° C. or more and that this heating step should be carried out before the above main growing substep. Further, as a highly concentrated raw material for the group III nitride crystal can be supplied due to a high saturated vapor pressure and the raw material can be supplied onto a substrate for growing in a relatively stable state even in the main growing substep at a temperature of 1,200° C. or more, it is preferred that an aluminum nitride crystal or a mixed crystal of aluminum nitride and another group III nitride should be produced as the group III nitride crystal by using aluminum halide or a mixture of aluminum halide and a halide of a group III element except for aluminum as the group III halide in the above method (1).

BRIEF DESCRIPTION OF THE DRAWING

FIG. 1 is a schematic diagram of a typical chemical vapor deposition apparatus used in the present invention.

BEST MODE FOR CARRYING OUT THE INVENTION

As described above, the present invention is aimed to obtain a high-quality group III nitride crystal layer, especially an aluminum-based group III nitride crystal layer having a smooth surface by employing only HVPE without employing MOVPE. Therefore, the method of the present invention comprises the step of growing a group III nitride crystal layer by vapor-phase growth on a single crystal substrate by contacting the heated single crystal substrate with a raw material gas containing a group III halide and a compound having a nitrogen atom like conventional HVPE.

The group III nitride crystal which is to be produced by the method of the present invention means a crystal of a nitride of a group III element, and the group III element means at least one element selected from the group consisting of elements belonging to the group III (or group 13) of the periodic table, that is, B, Al, Ga, In and Tl. In the present invention, since it is extremely difficult to obtain a crystal layer having a smooth surface efficiently at a low cost by another method and the use of the method of the present invention has a great advantage, it is preferred to produce an aluminum-based group III nitride crystal, that is, an aluminum nitride crystal, or a mixed crystal of aluminum nitride and a nitride of at least one element selected from group III elements except for aluminum, specifically B, Ga, In and Tl as the group III nitride crystal.

As the single crystal substrate and the raw material gas used in the method of the present invention, what are used in conventional HVPE may be used without restriction. As the single crystal substrate may be used sapphire, silicon nitride, aluminum nitride, gallium nitride, zinc oxide, silicon or zirconium boride. When a thick film of a group III nitride crystal is formed on the substrate, separated from the substrate and used as a self-supporting substrate, all of the above substrates can be used advantageously. When they are used as a template substrate, sapphire is preferred from the viewpoints of excellent ultraviolet transmission and cost.

As the raw material gas may be used a combination of a group III halide gas as a group III element source and a gas of a compound having a nitrogen atom such as ammonia as a nitrogen source.

The group III halide gas is not particularly limited if it is a gas of a halide of a group III element. However, it is preferred to use an aluminum halide gas or a mixed gas of an aluminum halide gas and a gas of a halide of a group III element except for aluminum from the above reasons. An aluminum trichloride gas is preferably used as the aluminum halide gas. A gallium monochloride gas, gallium trichloride gas, indium monochloride gas or indium trichloride gas may be used as the gas of a halide of a group III element except for aluminum. When a mixed gas of an aluminum halide gas and a gas of a halide of a group III element except for aluminum is used as the group III halide gas, the composition of the gas may be suitably set according to the composition of the target mixed crystal of an aluminum-based group III nitride. In this case, since the ratio of the group III nitride to be introduced onto the substrate differs according to the type of the group III element and therefore, the supply ratio of the group III halide gas may not correspond to the composition of the mixed crystal, it is preferred to investigate the relationship between the composition of the gas and the composition of the product in advance.

The group III halide gas can be obtained by reacting a group III metal such as aluminum, gallium or indium with hydrogen halide or chlorine. This reaction can be carried out in the manner described in JP-A 2003-303774. The group III halide gas can also be obtained by heating a group III halide itself such as aluminum halide, gallium halide or indium halide to evaporate it. In this case, it is preferred to use an anhydrous group III halide crystal having a low total content of impurities. When impurities are contained in the raw material gas, a defect is introduced in the formed crystal and also the physical and chemical properties of the crystal change. Therefore, substances having high purity must be used as the raw materials of the gas.

As the nitrogen source gas, a reactive gas containing nitrogen is used, and an ammonia gas is preferred from the viewpoints of cost and handling ease.

The group III halide gas and the nitrogen source gas are preferably introduced into a gas mixer after they are diluted with a carrier gas to a desired concentration. The carrier gas may be a single-element gas such as hydrogen, nitrogen, helium or argon, or a mixed gas thereof. It is preferred that an impurity gas component such as oxygen, steam, carbon monoxide or carbon dioxide should be removed from these gases by using a refining equipment.

The most important feature of the method of the present invention is that "the step of growing a group III nitride crystal by vapor-phase growth on a single crystal substrate by contacting the heated single crystal substrate with a raw material gas containing a group III halide and a compound having a nitrogen atom" in HVPE comprises an initial growing substep in which a group III nitride crystal layer is grown by vapor-phase growth on the single crystal substrate heated at a temperature of 1,000° C. or higher and lower than 1,200° C. and a main growing substep in which a group III nitride crystal is further grown by vapor-phase growth on the group III nitride crystal layer obtained in the initial growing substep heated at a temperature of 1,200° C. or higher.

This made it possible to produce a high-quality aluminum-based group III nitride crystal layer having a smooth surface by employing only HVPE without employing MOVPE.

For instance, when the main growing substep is carried out without carrying out the initial growing substep, the decomposition of the single crystal substrate cannot be avoided, thereby making it impossible to obtain a group III nitride crystal layer having high surface smoothness. Even when growth is carried out in multiple stages and when initial growing is carried out at a substrate temperature lower than 1,000° C., a desired effect cannot be obtained. That is, when the substrate temperature in the initial growing substep is set lower than 550° C. as disclosed by JP-A 2006-335607, the surface smoothness of the group III nitride crystal layer obtained through the main growth substep degrades though its crystal quality is excellent. When the substrate temperature in the initial growing substep is set to 550° C. or higher and lower than 1,000° C., a group III nitride crystal layer having high crystal quality is not obtained.

In the method of the present invention, the reason why a group III nitride crystal having high crystallinity can be grown without reducing its surface smoothness only when the substrate temperature in the initial growing substep is set to 1,000° C. or higher and lower than 1,200° C. and the substrate temperature in the main growing substep is set to 1,200° C. or higher seems to be considered as follows. Nuclei which are stable to heat and have excellent crystallinity are uniformly formed in the initial growing substep and group III nitride crystals grow in the transverse direction as well in the main growing substep, inheriting the high crystallinity of the nuclei.

In contrast to this, when the substrate temperature in the initial growing substep is set to a very low temperature of 300 to 550° C., an intermediate layer whose internal bonding is weak is formed and nuclei having high crystallinity are formed due to the mass transfer during the subsequent temperature elevation step, whereby group III nitride crystals having high crystallinity can be grown in the main growing substep. However, the nuclei formed at this point have a kind of 3-D agglomerated structure and are transformed at the time of formation, and the distribution of the nuclei is apt to become nonuniform, whereby crystal growth becomes nonuniform and the surface smoothness degrades. When the substrate temperature in the initial growing substep is set higher than 550° C. and lower than 1,000° C., an intermediate layer in which the mass transfer hardly occurs during the temperature elevation step is formed but the intermediate layer grown at this temperature range becomes polycrystalline and its crystal orientation is not fixed, whereby the crystal orientation of the underlying layer is inherited in the subsequent main growing substep and thereby a group III nitride crystal having high crystal quality is not obtained. Further, even when the substrate temperature in the initial growing substep is set to 1,000° C. or higher and lower than 1,200° C. and when the substrate temperature in the main growing substep is set lower than 1,200° C., a group III nitride crystal does not grow in the transverse direction, whereby a single crystal is obtained but a group III nitride crystal layer having a smooth surface cannot be obtained.

The temperature of the single crystal substrate in the initial growing substep is preferably 1,000 to 1,200° C., particularly preferably 1,050 to 1,150° C. because an excellent single crystal having stably a low dislocation density and high surface smoothness can be obtained. For the same reason, the temperature of the single crystal substrate in the main growing substep is preferably 1,250 to 1,700° C., particularly preferably 1,300 to 1,600° C.

In the initial growing substep, a group III nitride crystal layer having a relatively good surface state (may also be referred to as "intermediate layer" hereinafter) is formed on the surface of the single crystal substrate to prevent the decomposition of the single crystal substrate and maintain the good surface state in the temperature elevation step before the start of the main growing substep. At this point, it is preferred that the intermediate layer should be formed to cover the entire main surface of the single crystal substrate and that the thickness of the intermediate layer should be not less than 0.5 nm from the viewpoint of the above protection effect and not less than 5 nm from the viewpoint of the prevention of the diffusion of impurities from the substrate. When the intermediate layer is made thick, its effect remains unchanged and film formation at a low temperature is slower than film formation at a high temperature, thereby reducing productivity. Therefore, the thickness of the intermediate layer is preferably not more than 500 nm, particularly preferably not more than 300 nm.

Vapor-phase growth in the initial growing substep may be carried out in the same manner as the vapor-phase growth of the group III nitride crystal by conventional HVPE except that the temperature of the single crystal substrate is set to a predetermined temperature. However, it is preferred that the feed rates of the group III halide gas and the nitrogen source gas as raw materials should be suitably adjusted to control the growth rate to 1 to 300 μm/h because the group III nitride crystal obtained in the main growing substep can be made better. When the intermediate layer is formed under the above conditions, the structure of the obtained intermediate layer has a columnar crystal state, and the crystal state and surface smoothness of the group III nitride crystal layer when formed by the main growing substep are apt to be high. Although the reason why the crystal state and surface smoothness of the III group nitride crystal layer formed in the main growing substep become high when the intermediate layer has a columnar crystal state is not found yet, the inventors of the present invention have experimentally confirmed that the crystal state of the intermediate layer is changed and has the above tendency by changing the film forming conditions.

In the method of the present invention, to carry out the main growing substep after the intermediate layer is formed, the temperature of the intermediate layer formed on the single crystal substrate is increased to 1,200° C. or higher, preferably 1,250 to 1,700° C., more preferably 1,300 to 1,600° C. During this, the supply of the raw material gas may be suspended or continued. The supply of either one of the group III halide gas and the nitrogen source gas can be suspended. However, in the above temperature elevation step, it is preferred that the nitrogen source gas such as ammonia should be kept flowing because the decomposition of the intermediate layer at a high temperature range can be prevented. Further, it is preferred that, after the temperature of the intermediate layer on the substrate reaches a temperature at which the main growing substep can be started, the temperature should be kept for a predetermined time to heat (also called "anneal") the group III nitride crystal layer obtained in the above initial growing substep. It seems that, during this annealing step, the crystallinity of the intermediate layer improves due to the occurrence of surface diffusion on the intermediate layer, thereby forming a crystal nucleus which is suitable for providing a good crystal in the crystal growth of the main growing substep.

As for the annealing time, when the group III nitride crystal layer is annealed for a long time, crystallinity is improved but the surface of the group III nitride crystal layer becomes rough in the main growing substep because the crystal nucleus becomes large. Therefore, the annealing time is preferably shorter than 7,200 seconds, particularly preferably 1 to 600 seconds. For the operational reason, the annealing temperature is generally set to the temperature of the intermediate layer on the substrate in the main growing substep and does not need to be made the same as the temperature of the intermediate layer in the main growing substep. After annealing is carried out at a temperature higher than the temperature of the intermediate layer in the main growing substep to reduce the temperature of the intermediate layer on the substrate, the main growing substep may be started. On the contrary, after annealing is carried out and the temperature of the intermediate layer on the substrate is further raised, the main growing substep may be started.

In the method of the present invention, after the end of the initial growing substep, annealing is optionally carried out, and then the raw material gas is brought into contact with the intermediate layer formed on the single crystal substrate heated at a temperature of 1,200° C. or higher to further grow a group III nitride crystal layer by vapor-phase growth on the intermediate layer formed on the single crystal substrate (main growing substep). By growing the group III nitride crystal layer by vapor-phase growth at a temperature of 1,200° C. or higher, preferably 1,250 to 1,700° C., particularly preferably 1,300 to 1,600° C., the crystallinity of the obtained crystal becomes high and the film forming rate can be made high. Since the main growing substep is carried out after the intermediate layer is formed in the method of the present invention, the deterioration of the surface state caused by the decomposition of the intermediate layer can be avoided and a group III nitride crystal layer which is excellent in surface morphology and surface smoothness can be formed.

The expression "excellent in surface morphology" means that, when the surface of the formed group III nitride crystal layer is observed through an electron microscope, pits and projections (they generally have a scale of 0.1 μm or ore) are not substantially seen. The expression "excellent in surface smoothness" means that, when any 10 μm×10 μm area of the surface of the group III nitride crystal layer is observed through an atomic force microscope, the arithmetic average surface roughness (Ra value) is preferably 1.0 nm or less, more preferably 0.5 nm or less.

As a secondary effect obtained by forming the intermediate layer, the group III nitride crystal layer formed in the main growing substep has an extremely low total content of impurities, especially impurities derived from the single crystal substrate. Although the detailed mechanism that the total content of impurities becomes very low is not known at the moment, it is considered that the intermediate layer has the function of blocking impurities diffused from the substrate. When a sapphire substrate is used as the substrate and the group III nitride crystal layer is formed by HVPE at a high temperature, elemental oxygen is contained in an amount of about $3 \times 10^{19}$ cm$^{-3}$ as an elemental impurity because it is diffused from the substrate. By forming the intermediate layer, the content of the elemental oxygen can be reduced to $1 \times 10^{19}$ cm$^{-3}$ or less, preferably $4 \times 10^{18}$ cm$^{-3}$ or less. When a large amount of oxygen is contained in the group III nitride crystal layer, it exerts a bad influence on electric properties. For instance, when an aluminum nitride-based semiconductor crystal is doped with elemental silicon to produce an n type semiconductor, an oxygen atom functions to compensate for an electron carrier produced by doping the elemental silicon, thereby deteriorating the properties of the semiconductor. The intermediate layer has the effect of blocking the inclusion of not only an oxygen atom when a sapphire substrate is used but also an element (atom) contained in the single crystal substrate by diffusion according to the type of the single crystal substrate in use.

The total content of impurity atoms contained in the group III nitride crystal layer formed in the main growing substep can be measured by secondary ion mass spectrometry (SIMS). In this method, a cesium ion (or an oxygen ion according to the element to be detected) which is a primary ion is applied to an object to be measured in high vacuum and the amounts of ion species (secondary ions) coming from the object to be measured and sputtered by the cesium ion are determined by a mass spectrometer to measure the composition and concentration profile of elements contained in the object to be measured.

Vapor-phase growth in the main growing substep can be carried out in the same manner as the vapor-phase growth of a group III nitride crystal by conventional HVPE except that the temperature of the single crystal substrate having the intermediate layer on the surface is set to a predetermined value. The thickness of the group III nitride crystal layer (also called "main growth layer") formed in the main growing substep may be suitably determined according to purpose. For instance, when the obtained product is used as a template substrate, the thickness is preferably 0.1 to 10 μm, particularly preferably 0.5 to 2 μm. To produce a self-supporting substrate composed of the group III nitride crystal, the thickness is preferably 10 to 1,000 μm, particularly preferably 50 to 500 μm.

With the method of the present invention, a laminate comprising the intermediate layer and the main growth layer which are formed on the single crystal substrate sequentially can be obtained. This laminate may be used as a template substrate for a semiconductor device as it is and also as a self-supporting substrate composed of the group III nitride crystal when the main growth layer is separated from the laminate.

To separate the main growth layer from the laminate of the present invention, a method in which the main growth layer is removed by a laser after the end of the main growing substep, a method in which a base substrate for growth is removed by reactive ion etching, and a method in which a thermally decomposable substance such as a ZnO or GaN layer is inserted into the interface to remove the main growth layer from the substrate layer during growth can be advantageously employed.

A semiconductor device can be obtained by laminating a semiconductor layer on the template substrate or the self-supporting substrate obtained as described above. To manufacture a semiconductor light emitting device, an n type clad layer, an active layer, a p type clad layer and a p type electrode may be laminated on the template substrate or the self-supporting substrate sequentially. These layers can be formed by a conventional method, for example, a method described in Japanese Journal of Applied Physics, Vol. 44, No. 10, 2005, pp. 7191-7206.

A detailed description is given of a production example of an aluminum nitride-based group III nitride crystal layer by the method of the present invention with reference to the accompanying drawing.

The apparatus shown in FIG. 1 comprises a reactor body composed of a cylindrical quartz glass reactor tube 11, external heating means 12 arranged external to the reactor tube 11 and a susceptor 13 arranged internal to the reactor tube 11. The carrier gas and the raw material gas are supplied from one end of the reactor tube 11, and an exhaust gas which consists of the carrier gas and an unreacted reaction gas is discharged from an opening formed in the side wall near the other end. The above external heating means 12 is not used to heat the single crystal substrate 14 but to maintain mainly the temperature of the reaction gas in a reaction region at a predetermined value and not necessarily essential. As the external heating means 12 may be used a resistance heater, high-frequency heater, high-frequency induction heater or lamp heater. The above susceptor 13 can hold the single crystal substrate 14 on the top surface.

In the reactor tube on the raw material gas supply side of the apparatus shown in FIG. 1, the group III halide gas diluted with the carrier gas is supplied from a nozzle 15, and the nitrogen source gas diluted with the carrier gas is supplied into a flow passage which is the space between the nozzle 15 and the wall of the reactor tube. The flow passage of the above group III halide gas is connected to "group III halide gas supply source" (unshown in the figures) by a pipe. Meanwhile, the flow passage of the nitrogen source gas is connected to "nitrogen source gas supply source" (unshown in the figures) through flow rate control means by a pipe, and a pipe for connecting a carrier gas supply source is connected to a pipe on the downstream side of the flow rate control means by the flow rate control means so that the nitrogen source gas can be diluted with the carrier gas in a desired dilution ratio. As the nitrogen source gas is used a reactive gas containing nitrogen but preferably an ammonia gas from the viewpoints of cost and handling ease.

In the apparatus shown in FIG. 1, a composite heater obtained by coating a carbon heat generator with a composite sintered material of aluminum nitride and boron nitride is used as the susceptor 13 to heat the single crystal substrate 14 installed on the susceptor 13. The end face of the heater has an electrode, and electric power is applied to the susceptor through the electrode 16 from the outside. Since the heat generator of the susceptor is coated with the composite sintered material having excellent corrosion resistance to a hydrogen gas, group III halide gas, ammonia gas and silicon source gas, the susceptor can be used stably at room temperature to 1,600° C. which is the use temperature range of the present invention. Although the susceptor is used in the present invention, any heating means is acceptable if it can heat only the substrate at 1,200° C. or higher as described in JP-A 2003-303774.

In the method of the present invention, the apparatus shown in FIG. 1 is used to maintain the single crystal substrate 14 at a temperature higher than the temperature of the wall of the reactor within the reaction range of the raw material gas so as to grow an aluminum nitride-based semiconductor crystal. Crystal growth can be carried out by the following procedure.

That is, after the single crystal substrate is set on the susceptor in the reactor, the carrier gas is flowed in the reactor to substitute the atmosphere in the reactor with the carrier gas atmosphere. Thereafter, in order to remove organic material adhered to the surface of the single crystal substrate, electric power is supplied to the susceptor to heat it, or the external heating means is used to heat the single crystal substrate so as to maintain the single crystal substrate at a temperature range of 1,000 to 1,100° C. for 1 to 10 minutes (this treatment will be also called "thermal cleaning" hereinafter). After the end of thermal cleaning, the substrate temperature is set to 1,000° C. or higher and lower than 1,200° C. which is the growth temperature of the intermediate layer, and then the group III halide gas and the nitrogen source gas which are raw material gases are introduced into the reactor to start a reaction so as to carry out the initial growing substep for growing an aluminum nitride-based group III nitride crystal layer as the intermediate layer on the substrate.

After the reaction is carried out for a predetermined time to obtain an intermediate layer having a desired thickness, the supply of the group III halide gas is stopped to suspend growth and the temperature of the substrate having the formed intermediate layer is set to 1,200° C. or higher, preferably 1,200 to 1,600° C. which is the growth temperature in the main growing substep. While the substrate temperature reaches the growth temperature in the main growing substep, the intermediate layer may be annealed by maintaining that temperature for preferably 7,200 seconds or less. Thereafter, the supply of the group III halide gas is resumed to further grow an aluminum nitride-based group III nitride crystal by vapor-phase growth as the main growth layer on the intermediate layer (main growing substep). Although the diffusion of the raw material gases adsorbed to the growth surface is promoted by carrying out vapor-phase growth at the above high temperature range, reduction of dislocations and improvement of the surface smoothness are occurred during the growth of the aluminum nitride-based group III nitride crystal in which the crystal nucleus are the crystals constituting the intermediate layer, thereby making it possible to grow a high-quality aluminum nitride-based semiconductor crystal layer. After the end of the main growing substep, the supply of the group III halide gas is stopped to terminate growth and the substrate is cooled and taken out.

When a gallium nitride substrate or an aluminum nitride substrate is used as the single crystal substrate, a nitrogen source gas such as ammonia is preferably supplied into the reactor to prevent the thermal decomposition of the single crystal substrate material and the grown intermediate layer. At this point, the partial pressure of the nitrogen source gas in the atmosphere may be maintained at 0.0001 atm or higher.

Conditions such as the partial pressures and flow rates of the reaction gases (raw material gases) and the carrier gas in the initial growing substep and the main growing substep may be suitably set according to the size and shape of the reactor. In general, the feed rate of the group III halide gas is determined in consideration of the growth rate of the aluminum nitride-based group III nitride crystal layer on the single crystal substrate. When the ratio of the volume in the standard state of the group III halide gas to the total volume in the standard state of all the gases (carrier gas, group III halide gas, nitrogen source gas) supplied onto the single crystal substrate is defined as the supply partial pressure of the group III halide gas, it is preferably $1\times10^{-6}$ to $1\times10^{-1}$ atm. The feed volume of the nitrogen source gas is preferably 1 to 100 times, particularly preferably 2 to 20 times higher than the feed volume of the above group III halide gas. However, as the optimum value is influenced by the shape of the reactor and the rate and pressure of a gas flow, the feed volume is not limited to this. The inside pressure of the system may be any one of a reduced pressure, normal pressure and increased pressure.

The obtained aluminum nitride-based group III nitride crystal layer can be evaluated as follows. The thickness of the film can be calculated from the area of the substrate, a change in the weight of the substrate before and after growth and the density of the aluminum nitride-based semiconductor crystal. The crystallinity can be evaluated by the measurement of an X-ray rocking curve. The term "rocking curve" means a diffraction obtained by fixing a detector at a position having an angle double the angle at which a specific crystal face satisfies Bragg's diffraction condition and changing the incident angle of X radiation. Whether the crystallinity is acceptable or not can be judged from the half-value width of the rocking curve, and it can be said that as the half value width becomes smaller, the crystallinity of the aluminum nitride-based group III nitride crystal layer becomes higher. The measurement of the rocking curve is made on the {002} face called "tilt" and the {100} face called "twist". The surface morphology is evaluated as the numbers of pits and projections per unit area determined by following procedure. That is, the numbers of pits and projections per unit area is determined by xeroradiographing 5 observation views with a field emission scanning electron microscope at 5,000-fold agnification, counting the numbers of pits and projections and dividing these numbers by the area of the observation view field. It is preferred that there should be no pits and no projections. The surface smoothness is evaluated as arithmetic average roughness (Ra value) by observing the surface through an atomic force microscope. The concentration of impurities can be determined by secondary ion mass spectrometry using a cesium ion (or an oxygen ion according to the element to be detected) as a primary ion.

According to the present invention, as described above, a group III nitride crystal such as an aluminum nitride crystal having high crystal quality, a good surface morphology and excellent surface smoothness can be produced by employing only HVPE without employing MOVPE. Therefore, a template substrate having a group III nitride crystal layer on the surface or a self-supporting substrate composed of a group III nitride single crystal can be produced efficiently at a low cost. Since the template substrate and the self-supporting substrate obtained as described above have a good surface morphology and excellent surface smoothness, a semiconductor laminated film such as a light emitting device can be directly formed on these substrates without polishing such as chemical mechanical polishing, thereby making it possible to greatly contribute to the improvement of light emitting device performance, the implementation of an ultraviolet light source and the reduction of the production cost of a light emitting device.

As a further effect of the present invention, it has been found that the group III nitride crystal layer grown in the above main growing substep has the effect of reducing the amounts of impurity elements. It is considered that this is due to the fact that the group III nitride crystal layer of the first stage grown in the initial growing substep blocks the diffusion of impurities from the substrate. It is difficult to control the impurities diffused from the single crystal substrate and contained in the group III nitride crystal because they are not intentionally added impurities, and the existence of impurities has a great bad influence upon the electric properties of a semiconductor. Therefore, it is needless to say that the effect of blocking diffusion is extremely preferred.

EXAMPLES

The following examples are provided for the purpose of further illustrating the present invention but are in no way to be taken as limiting.

Example 1

In this example, an aluminum nitride semiconductor crystal was grown by using the reactor tube shown in FIG. 1. In this example, metal aluminum placed at an upstream of the reactor tube and a hydrogen chloride gas were reacted with each other at 500° C. to produce an aluminum trichloride gas. A resistance heating furnace was used as the external heater, a susceptor composed of a composite sintered material of aluminum nitride and boron nitride and having a carbon heat generator was set in the reactor tube, and electric power was supplied to the carbon heat generator from the outside to heat a sapphire (0001) substrate placed on the susceptor at 1,200° C. or higher. The aluminum trichloride gas was used as an aluminum source gas, an ammonia gas was used as a nitrogen source gas, and both were reacted with each other to grow an aluminum nitride semiconductor crystal.

First, the sapphire (0001) substrate was placed on the susceptor in the reactor tube, 300 sccm of a hydrogen gas was supplied from the nozzle 15 under normal pressure, and 1,700 sccm of a hydrogen gas and 600 sccm of a nitrogen gas were mixed together, were supplied from the space between the nozzle 15 and the reactor tube and were flowed at a total of 2,600 sccm as a carrier gas. Then, the external heater was used to heat the reactor tube at 500° C. from the outside, and electric power was applied to the susceptor to heat it at 1,065° C. When the temperature reached 1,065° C., it was maintained for 10 minutes to carry out the thermal cleaning of the substrate. Then, the aluminum trichloride gas was supplied to ensure that its supplying partial pressure became $5\times10^{-4}$ atm based on the total flow volume, the ammonia gas was supplied to ensure that its supplying partial pressure became 2.5 times higher than the supplying partial pressure of the aluminum trichloride gas, and this state was maintained for 5 seconds to grow an aluminum nitride crystal as an intermediate layer. As for the intermediate layer grown in this example, an experiment was conducted to grow only an intermediate layer separately so as to confirm that its film thickness was 22 nm by observing it from the cross-sectional direction through a scanning electron microscope.

After the intermediate layer was grown, the supply of only the aluminum trichloride gas was suspended, and the susceptor was heated up to 1,300° C. in 7 minutes while the ammonia gas was supplied. The feed volume of the ammonia gas was set the same as the feed volume when the intermediate layer was grown. After the temperature reached 1,300° C., the supply of the aluminum trichloride gas was resumed. The feed volume of the aluminum trichloride gas was $5\times10^{-4}$ atm in terms of supplying partial pressure based on the total flow volume, the feed volume of the ammonia gas was 2.5 times higher than the supplying partial pressure of the aluminum trichloride gas, and this state was maintained for 30 minutes to grow an aluminum nitride crystal.

After 30 minutes of growth, the supply of the aluminum trichloride gas was suspended, electric power applied to the susceptor was reduced to lower the temperature, and then the temperature of the external heater was reduced. At this point, to prevent the decomposition of the aluminum nitride semiconductor crystal layer formed on the substrate, the ammonia gas was flowed in the reactor tube until the temperature of the heater dropped to 500° C. Further, after confirming the heater temperature was cooled to around room temperature, the substrate was taken out from the reactor.

The thickness of the grown aluminum nitride semiconductor crystal layer was 4.5 µm, and the growing rate was 9.0 µm/h. As for crystallinity, the tilt was 9.6 min and the twist was 19.8 min. The surface appearance of the obtained aluminum nitride semiconductor crystal layer was mirror-like, and when the surface was observed through an atomic force microscope, Ra was 0.38 nm. No pits and no projections were observed by observation through an electron microscope. The concentration of oxygen measured by secondary ion mass spectrometry was $4\times10^{18}$ cm$^{-3}$.

Example 2

In this example, an aluminum nitride semiconductor crystal was grown by the same procedure under the same conditions as in Example 1 except that the thickness of the intermediate layer, that is, the growth time of the aluminum nitride crystal in the initial growing substep was changed to 15 seconds. The thickness of the intermediate layer was estimated at 65 nm from the relationship with the growth time.

The thickness of the aluminum nitride semiconductor crystal layer grown in the main growth substep was 4.9 µm, and the growing rate was 9.8 µm/h. As for crystallinity, the tilt was 12.6 min and the twist was 20.4 min. The surface appearance of the obtained aluminum nitride crystal layer was mirror-like, and when the surface was observed through an atomic force microscope, Ra was 0.48 nm. No pits and no projections were observed by observation through an electron microscope.

Example 3

In this example, an aluminum nitride semiconductor crystal was grown by the same procedure under the same conditions as in Example 1 except that the thickness of the intermediate layer, that is, the growth time of the aluminum nitride crystal in the initial growing substep was changed to 30 seconds. The thickness of the intermediate layer was estimated at 135 nm from the relationship with the growth time.

The thickness of the aluminum nitride crystal layer grown in the main growth substep was 3.7 µm, and the growing rate was 7.4 µm/h. As for crystallinity, the tilt was 10.2 min and the twist was 32.4 min. The surface appearance of the obtained aluminum nitride semiconductor crystal layer was mirror-like, and when the surface was observed through an atomic force microscope, Ra was 0.55 nm. No pits and no projections were observed by observation through an electron microscope.

Example 4

In this example, an aluminum nitride semiconductor crystal was grown by the same procedure under the same conditions as in Example 1 except that the growing temperature of the intermediate layer was changed to 1,100° C.

The thickness of the aluminum nitride crystal layer grown in the main growth substep was 5.1 µm, and the growing rate was 10.2 μm/h. As for crystallinity, the tilt was 13.3 min and the twist was 40.2 min. The surface appearance of the obtained aluminum nitride semiconductor crystal layer was mirror-like, and when the surface was observed through an atomic force microscope, Ra was 0.42 nm. No pits and no projections were observed by observation through an electron microscope.

Example 5

In this example, an aluminum nitride semiconductor crystal thick film was grown by using a silicon substrate as an initial substrate placed on the susceptor, and further the silicon substrate was removed by chemically treating the obtained aluminum nitride semiconductor crystal thick film on the silicon substrate to obtain a self-supporting substrate.

First, the (111) silicon substrate was immersed in a 5% aqueous solution of hydrofluoric acid for 30 seconds to remove an oxide coating formed on the surface so as to obtain a hydrogen-terminated surface. This (111) silicon substrate was placed on the susceptor in the reactor tube, 300 sccm of a hydrogen gas was supplied from the nozzle 15 under normal pressure, and 1,700 sccm of a hydrogen gas and 600 sccm of a nitrogen gas were mixed together, supplied from the space between the nozzle 15 and the reactor tube and circulated at a total of 2,600 sccm as a carrier gas. Then, the external heater was used to heat the reactor tube at 500° C. from the outside, and electric power was applied to the susceptor to heat it at 1,140° C. After the temperature reached 1,140° C., an aluminum trichloride gas was supplied to ensure that its supplying partial pressure became $5 \times 10^{-4}$ atm based on the total flow volume, an ammonia gas was supplied to ensure that its supplying partial pressure became 8 times higher than the supplying partial pressure of the aluminum trichloride gas, and this state was maintained for 600 seconds to grow an aluminum nitride crystal as an intermediate layer. As for the intermediate layer grown in this example, an experiment was conducted to grow only an intermediate layer separately so as to confirm that its film thickness was 480 nm by observing it from the cross-sectional direction through a scanning electron microscope.

After the intermediate layer was grown, the supply of only the aluminum trichloride gas was suspended, and the susceptor was heated up to 1,230° C. in 5 minutes while the ammonia gas was supplied. The feed volume of the ammonia gas was set the same as the feed rate when the intermediate layer was grown. After the temperature reached 1,230° C., the supply of the aluminum trichloride gas was resumed. The feed volume of the aluminum trichloride gas was $6 \times 10^{-4}$ atm in terms of supplying partial pressure based on the total flow volume, the feed volume of the ammonia gas was 4 times higher than the supplying partial pressure of the aluminum trichloride gas, and this state was maintained for 420 minutes to grow an aluminum nitride crystal.

After 420 minutes of growth, the supply of the aluminum trichloride gas was suspended, electric power applied to the susceptor was reduced to lower the temperature, and then the temperature of the external heater was reduced. At this point, to prevent the decomposition of the aluminum nitride semiconductor crystal layer formed on the substrate, the ammonia gas was flowed in the reactor tube until the temperature of the heater dropped to 500° C. Further, after confirming the heater temperature was cooled to around room temperature, the substrate was taken out from the reactor.

Further, the aluminum nitride semiconductor crystal grown on the (111) silicon substrate was immersed in an etchant prepared by mixing together 50% hydrofluoric acid, concentrated nitric acid, 98% acetic acid and pure water in a volume ratio of 1:2:1:4 to chemically dissolve only the (111) silicon substrate so as to obtain a self-supporting substrate composed of the aluminum nitride semiconductor crystal layer.

The thickness of the grown aluminum nitride semiconductor crystal layer was 112 μm, and the growing rate was about 16 μm/h. As for crystallinity, the tilt was 15.9 min and the twist was 22.5 min. The surface appearance of the obtained aluminum nitride semiconductor crystal layer was mirror-like, and when the surface was observed through an atomic force microscope, Ra was 0.95 nm. No pits and no projections were observed by observation through an electron microscope. The concentration of oxygen at a depth of 10 μm from the surface measured by secondary ion mass spectrometry was $1 \times 10^{18}$ cm$^{-3}$, and the concentration of elemental silicon which is an impurity considered to be derived from the substrate was $1 \times 10^{19}$ cm$^{-3}$.

Example 6

An aluminum nitride semiconductor crystal was grown by the same procedure under the same conditions as in Example 1 except that an intermediate layer having a thickness of 22 nm was formed at 1,065° C. and that the growing temperature in the subsequent step was changed to 1,450° C.

The thickness of the aluminum nitride crystal layer grown in the main growth substep was 5.3 μm, and the growing rate was 10.6 μm/h. As for crystallinity, the tilt was 6.0 min and the twist was 8.4 min. The surface appearance of the obtained aluminum nitride semiconductor crystal layer was mirror-like, and when the surface was observed through an atomic force microscope, Ra was 0.51 nm. No pits and no projections were observed by observation through an electron microscope.

Comparative Example 1

In this comparative example, an aluminum nitride crystal was directly grown on a sapphire substrate at 1,300° C. without forming an intermediate layer. After the sapphire substrate was placed in the reactor tube, the temperature was raised to 1,300° C. to carry out thermal cleaning for 10 minutes, and an aluminum trichloride gas and an ammonia gas were introduced to grow an aluminum nitride crystal. The feed volume of the gases, the feed volume of the raw material gas, other conditions and the procedure were the same as in Example 1.

The thickness of the grown aluminum nitride crystal layer was 4.4 μm, and the growing rate was 8.8 μm/h. As for crystallinity, the tilt was 21.6 min and the twist was 111 min. The surface appearance of the obtained aluminum nitride semiconductor crystal layer was tarnished, a large number of pits were observed by observation through an electron microscope, and the density of pits and projections was $1.9 \times 10^7$ (=1.9E+07) cm$^{-2}$. When the surface devoid of the pits was observed through an atomic force microscope, Ra was 0.61 nm. The aluminum nitride crystal layer could not be used to grow a semiconductor laminated film such as a light emitting device thereon. The concentration of oxygen measured by secondary ion mass spectrometry was $3 \times 10^{19}$ cm$^{-3}$.

Comparative Example 2

An aluminum nitride crystal was grown by the same procedure under the same conditions as in Comparative Example 1 except that the aluminum nitride crystal was directly grown on a sapphire substrate at 1,200° C.

The thickness of the grown aluminum nitride crystal layer was 5.5 μm, and the growing rate was 11 μm/h. As for crystallinity, the tilt was 18.6 min and the twist was 101 min. Although the surface appearance of the obtained aluminum nitride crystal layer was like a mirror, a large number of projections were observed by observation through an electron microscope, and the density of pits and projections was $8.7 \times 10^5$ (=8.7E+05) cm$^{-2}$. When the surface devoid of the pits was observed through an atomic force microscope, Ra was 0.82 nm. However, the aluminum nitride crystal layer could not be used to grow a semiconductor laminated film such as a light emitting device thereon.

Comparative Example 3

The growing temperature and film thickness of the intermediate layer were set the same as in Example 1, and an aluminum nitride crystal was grown by the same procedure under the same conditions as in Example 1 except that the growth temperature in the main growing substep was changed to 1,100° C.

The thickness of the aluminum nitride crystal layer formed on the intermediate layer was 6.6 μm, and the growing rate was 13.2 μm/h. As for crystallinity, the tilt was 30 min and the twist was 336 min. The surface appearance of the obtained aluminum nitride semiconductor crystal layer was tarnished, and a large number of projections were observed by observation through an electron microscope. The projections were densely formed on the surface, and it was impossible to calculate the density of pits and projections. As for surface smoothness, the level differences of the projections were too large, thereby making it impossible to observe the surface through an atomic force microscope. The aluminum nitride semiconductor crystal layer could not be used to grow a semiconductor laminated film such as a light emitting device thereon.

Comparative Example 4

An aluminum nitride crystal layer was grown by the same procedure under the same conditions as in Example 1 except that an intermediate layer having a thickness of 22 nm was formed at 800° C. The thickness of the aluminum nitride crystal layer formed on the intermediate layer was 5.1 μm, and the growing rate was 10.2 μm/h. As for crystallinity, the tilt was 45 min and the twist was 85 min. Although the surface appearance of the obtained aluminum nitride semiconductor crystal layer was like a mirror, projections were observed by observation through an electron microscope, and the density of pits and projections was $5.2 \times 10^7$ (=5.2E++07) cm$^{-2}$. As for surface smoothness, since the projections were existent, Ra was 1.41 nm.

Comparative Example 5

In this comparative example, an intermediate layer having a thickness of 50 nm was grown at 450° C. An aluminum nitride crystal was grown by the same procedure under the same conditions as in Example 1 except that the step of annealing at 1,200° C. for 30 minutes in an ammonia gas mixed atmosphere was added after the intermediate layer was formed and that the growing temperature in the main growing substep was changed to 1,400° C.

The thickness of the aluminum nitride crystal layer formed on the intermediate layer was 4.9 μm, and the growing rate was 9.8 μm/h. As for crystallinity, the tilt was 5.2 min and the twist was 12 min. Although the surface appearance of the obtained aluminum nitride semiconductor crystal layer was like a mirror, projections were observed by observation through an electron microscope, and the density of pits and projections was $7.1 \times 10^6$ (=7.1E+06) cm$^{-2}$. As for surface smoothness, since the projections were existent, Ra was 2.15 nm.

TABLE 1

| | First-stage conditions | Second-stage conditions | Thickness of the aluminum nitride crystal layer/μm | Tilt/ min | Twist/ min | Ra/nm | Density of pits and projections |
|---|---|---|---|---|---|---|---|
| Example 1 | 1065° C.-22 nm | 1300° C. | 4.5 | 9.6 | 19.8 | 0.38 | 0 |
| Example 2 | 1065° C.-65 nm | 1300° C. | 4.9 | 12.6 | 20.4 | 0.48 | 0 |
| Example 3 | 1065° C.-135 nm | 1300° C. | 3.7 | 10.2 | 32.4 | 0.55 | 0 |
| Example 4 | 1100° C.-22 nm | 1300° C. | 5.1 | 13 | 40 | 0.42 | 0 |
| Example 5 | 1140° C.-480 nm | 1230° C. | 112 | 15.9 | 22.5 | 0.95 | 0 |
| Example 6 | 1065° C.-22 nm | 1450° C. | 5.3 | 6 | 8.4 | 0.51 | 0 |
| Comparative Example 1 | None | 1300° C. | 4.4 | 21.6 | 111 | 0.61 | 1.9E+07 |
| Comparative Example 2 | None | 1200° C. | 5.5 | 18.6 | 101 | 0.82 | 8.7E+05 |
| Comparative Example 3 | 1065° C.-22 nm | 1100° C. | 6.6 | 30 | 336 | Not measurable | Not measurable |
| Comparative Example 4 | 800° C.-22 nm | 1300° C. | 5.1 | 45 | 85 | 1.41 | 5.2E+07 |
| Comparative Example 5 | 450° C.-50 nm | 1400° C. | 4.9 | 5.2 | 12 | 2.15 | 7.1E+06 |

The invention claimed is:

1. A method of producing a group III nitride crystal by vapor-phase growth, comprising the step of growing a group III nitride crystal on a single crystal substrate by contacting the heated single crystal substrate with a raw material gas containing a group III halide and ammonia, wherein the above step comprises an initial growing substep in which a group III nitride crystal layer is grown by vapor-phase growth on the single crystal substrate heated at a temperature of 1,000° C. or more and less than 1,200° C. and a main growing substep in which a group III nitride crystal is grown by vapor-phase growth on the group III nitride crystal layer obtained in the initial growing substep heated at a temperature of 1,200° C. or higher,
wherein in the initial growing substep, the supply partial pressure of the group III halide gas is $1\times10^{-6}$ to $1\times10^{-1}$ atom, and the feed volume of ammonia is 2 to 20 times higher than the feed volume of the group III halide gas.

* * * * *